United States Patent [19]
Gulczynski

[11] Patent Number: 4,476,441
[45] Date of Patent: Oct. 9, 1984

[54] PUSH-PULL POWER AMPLIFIER

[76] Inventor: Zdzislaw Gulczynski, Rosenheimerstr. 30, 8 Munich 80, Fed. Rep. of Germany

[21] Appl. No.: 330,202

[22] Filed: Dec. 14, 1981

[30] Foreign Application Priority Data

Dec. 23, 1980 [DE] Fed. Rep. of Germany ....... 3048648

[51] Int. Cl.³ .............................................. H03F 3/26
[52] U.S. Cl. .................................. 330/262; 330/267; 330/273; 330/272
[58] Field of Search ............. 330/262, 263, 266, 267, 330/272, 273

[56] References Cited

U.S. PATENT DOCUMENTS 4,348,644  9/1982  Kamiya ........................... 330/263

FOREIGN PATENT DOCUMENTS 0127709 10/1980 Japan ..................................... 330/267

Primary Examiner—James B. Mullins
Assistant Examiner—G. Wan
Attorney, Agent, or Firm—Balogh, Osann, Kramer, Dvorak, Genova & Traub

[57] ABSTRACT

A push-pull power amplifier with quiescent current regulator, in particular for low-frequency power amplifiers of high quality in which the quiescent current or currents of the output transistors is or are sampled at a predetermined output voltage and/or in a predetermined output voltage range of the amplifier, their values coded in one or more comparators and in one or more storage elements the corresponding values with which the desired values of the quiescent current or currents can be corrected or held are stored.

8 Claims, 5 Drawing Figures

PUSH-PULL POWER AMPLIFIER

BACKGROUND AND SUMMARY OF THE INVENTION

The present invention relates to a push-pull power amplifier with quiescent current regulator, in particular for low-frequency power amplifiers of high quality.

To ensure a linear mode of operation of the output transistors of a power amplifier from very weak output signals up to maximum output an operating point must be determined. The main problem with a push-pull output stage is keeping the desired quiescent current constant over a large temperature range.

In conventional power amplifiers in the operating point regulator a component is used which is thermally connected to output transistors. The thermal variations of an electrical value of the component are utilised to compensate changes of the quiescent current of the output stage.

Another method is the direct detection of the quiescent current. Its measured value is taken from a resistor in series with output transistors. The resistor is bridged by a diode to prevent the voltage drop in full-output operation from being too high. As measured value a mean value of the voltage at the resistor is assumed, which remains approximately constant in full-output operation.

When employing field-effect transistors for power amplification use is made of their property that for a given gate-source voltage $U_{GSO}$ their drain current is independent of the temperature. This voltage is kept constant.

In pulse-width modulation (PWM) power amplifiers the low-frequency input signal is converted to a digital form, processed and after reconvertion generated as an amplified signal at the output.

In the first method, the quiescent current, because of the spread of the parameters of the semiconductors used in the amplifier, must be set by hand. This is very time-consuming. Another disadvantage is the low long-time stability of the variable resistor compared with the fixed resistors. The sluggishness of the reaction on temperature increases in the transistor crystals of the output transistors is caused by poor thermal coupling with the sensor element. The additional stabilising steps in the form of resistors in series with the connected load reduce the output power obtainable.

The second method, although it avoids the aforementioned disadvantages, in the final result hardly improves the stability of the quiescent current. The influences of the ambient temperature, operating voltage, spread between units of the semiconductors used, amplitude and curve form of the output signal are not negligible.

In the third method the quiescent current is determined by the semiconductor manufacturers themselves and is optimal only from the point of view of temperature independence. Moreover, it is practically impossible for the $U_{GSO}$ voltage of the two complementary output transistors to be the same. The voltage is different even with different units of the same types of transistors.

PWM amplifiers require an enormous technological expenditure and are very costly. An LC filter network used for reconversion of the digital PWM signal considerably increases the output impedance of the amplifier. Also very critical are interference radiations extending into radio and television receiving ranges as well as sound-distorting intermodulation between the switching frequency and the signal frequencies.

The objective of the present invention is to keep fixed with greater accuracy compared with known circuits the quiescent current of the output transistors in view of the unit spread of the semiconductors, temperature and operating voltages, etc., used in the amplifier.

This problem is solved according to the invention in a push-pull power amplifier with quiescent current regulator, in particular for low-frequency power amplifiers of high quality in that the quiescent current or currents of the output transistors is or are sampled at a predetermined output voltage and/or in a predetermined output voltage range of the amplifier, their values coded in one or more comparators and in one or more storage elements the corresponding values with which the desired values of the quiescent current or currents can be corrected or held are stored.

This gives several very important advantages:
1. No thermal feedback to the output transistors is necessary.
2. No adjustments are necessary.
3. Low number of components.
4. Very high accuracy of the stabilising (with respect to operating voltage and temperature changes, etc.).
5. No quiescent current flows when the amplifier is switched on and the output transistors are not driven at full power. In conventional amplifiers a short-circuit current often flows here.
6. Simple integration possibility of the control stage.
7. Simple realisation of short-circuit protection.
8. Possibilities of digital processing of the quiescent current, e.g. digital storing of a corresponding measured value. Variation of the quiescent current depending on the magnitude of the output signal, warning signalisation before overheating of the output transistors, etc.

DETAILED DESCRIPTION OF THE INVENTION

Figure 1:
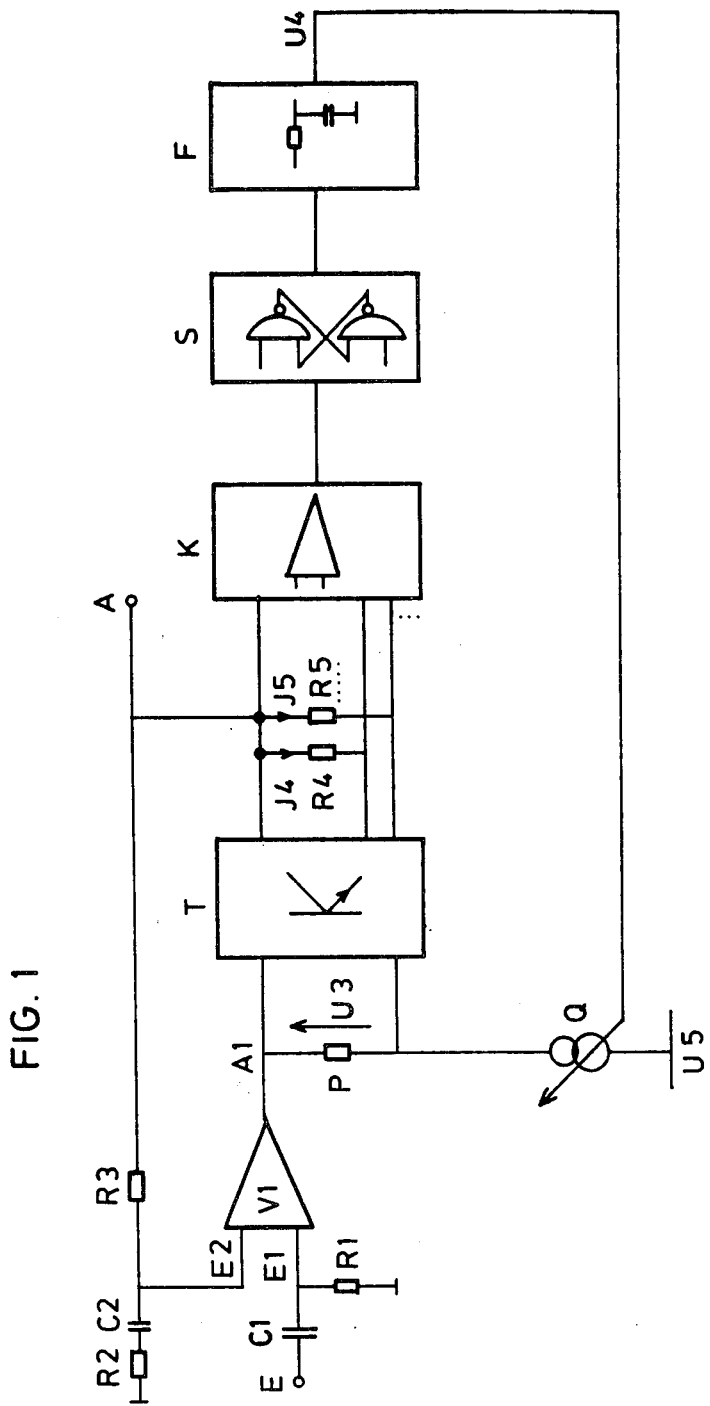
FIG. 1 illustrates the power amplifier according to the invention.

The power amplifier of FIG. 1 consists substantially of an operational amplifier V1 and a transistor stage T. The signal applied to an input E of the power amplifier is supplied via an RC member R1, C1 to a first input E1 of the operational amplifier V1. A second input E2 is connected via a voltage divider R2, R3, C2 to the actual output A of the output amplifier.

The operational amplifier controls the transistor stage T which consists of two power transistors connected in push-pull relationship. Should the voltage or power gain not be adequate in addition driver transistors may be provided; as output transistors power transistor packs may be used. Also connected to the output A1 of the operational amplifier V1 is a two-terminal network P which in the simplest case consists of a resistor. Applied to said two-terminal network is a control voltage U3 which is influenced mainly by a controllable current source Q.

The control voltage U3 contains information on temperatures of the transistors used in the transistor stage T. This voltage can be sampled, for example by providing an additional controllable current source which supplies exactly the same current as the current source Q and the output of which is supplied via a resistor with a fixed voltage. A resistor may also be connected between the current source Q and the voltage source U5.

If the voltage at the resistor or a part of said voltage produced in a temperature-dependent voltage divider taking account of temperature changes of certain transistors is amplified or coded in dependence upon the level, a temperature or a predetermined temperature of one or more transistors operating in the transistor stage T can be determined or estimated and possibly displayed.

The transistor stage T has several (at least two) outputs. One of these is the output A of the total amplifier. The other outputs are connected to the output A via resistors R4, R5, etc. They may also be bridged by diodes or transistors. The output currents J4, J5, of the output transistors of the transistor stage T flowing through the resistors are sampled at a predetermined output voltage and/or in a predetermined output voltage range in a comparator portion K and their values coded. It is thereby determined whether the quiescent currents are too high or too low. These values, with which the desired values of the quiescent currents can be regulated, are stored; this is done in two different manners, firstly in a digital store S which comprises one or more RS flip-flops (digital storage) and then in a store F with low-pass properties consisting of one or more RC members and possibly level converters (analog storage).

The analog voltage U4 available at the output of the store F controls the current source which is supplied with a fixed voltage U5. The quiescent currents can also be additionally influenced by a thermal feedback. One part of the two-terminal network P must then be thermally coupled to the output transistors. If the transistor stage T comprises a plurality of inputs a plurality of analog voltages U4 are made available which control a plurality of controllable current sources Q to which a plurality of two-terminal networks P are connected. The two-terminal networks are however always connected to the output A1 of the operational amplifier V1.

The digital store may also include a counter whose content corresponds to the control voltage U3. The quiescent current is regulated by reducing or increasing the content thereof. The production of the control signal for the store F is in the usual manner, for example by using a DA converter or the PWM method. A shift register may also be used whose individual bits are continuously shifted. The bits appearing at the output thereof are transmitted changed to the input thereof as long as the quiescent currents are adjusted by the change of the register content.

The values of the quiescent currents can be varied in accordance with the output voltage level in that the corresponding reference voltages are determined by the comparators of the part K with regard to the output voltage level of the power amplifier.

If the power amplifier is in the form of a bridge circuit two power amplifiers are required as illustrated in FIG. 1.

Figure 2:
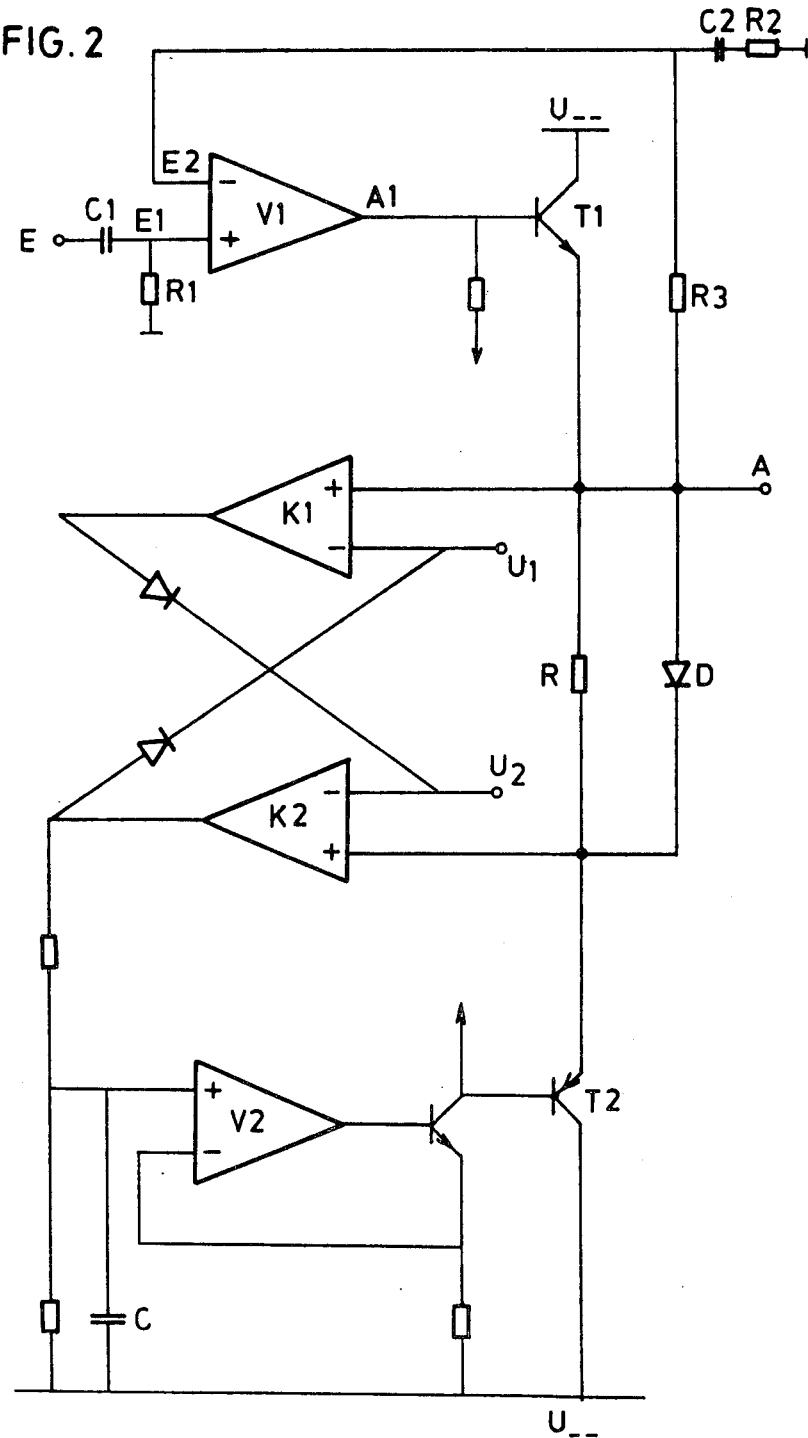
FIG. 2 is a simple example of embodiment.

FIG. 2 shows a simple example of embodiment.

It is first assumed that the input zero voltages (offset voltages) of the operation amplifier V1 and comparators K1 and K2 are equal to zero.

The sampling and digitising of the quiescent current takes place in the two comparators K1 and K2. In the rest condition, i.e. when the input voltage is also zero, the output voltage is zero as well. Since the reference voltage U1 is greater than zero the output voltage of K1 is $U_{--}$ (negative operating voltage). The quiescent current flows through the resistor R. The influence of the diode D is then negligible.

The voltage at R is compared with the reference voltage U2 in K2 which is negative and determines the value of the quiescent current.

If the quiescent current is too low the output voltage of K2 is $U_{++}$. The capacitor C is charged. If the quiescent current is too high the output voltage is $U_{--}$. The capacitor C is discharged.

The operational amplifier V2 and the connected transistor form so-called precision current sources. If the voltage at C increases the quiescent current becomes greater. If the output voltage rises from zero over U1 and the quiescent current is too small the comparator K1 is blocked. C is charged. If the quiescent current is too great K2 is blocked by K1. C is discharged. If the output voltage is below U1 C is always discharged.

The quiescent voltage value is thus sampled at U1 of the output voltage. If the quiescent current is too small the capacitor C is charged during a positive half wave. If it is too large C is discharged during the entire period of the input signal. The comparator portions K1 and K2 are combined with the store S in one functional block.

Determination of the reference voltages:

$$U_1 = U_{0SV1} + U_{0SK1} + U_0$$

$$U_2 = -RI_0 + U_{0SV1} + U_{0SK2}$$

$$U_2 = -RI_0 + U_1 - U_0 + U_{0SK2} - U_{0SK1}$$

wherein

U1, U2—reference voltages of K1, K2
$U_{0SV1}$, $U_{0SK1}$, $U_{0SK2}$—offset voltages of V1, K1, K2
I0—quiescent current
U0—a voltage such that U1 is always greater than zero.

The bases of the output transistors are connected together via a resistor.

Figure 3:
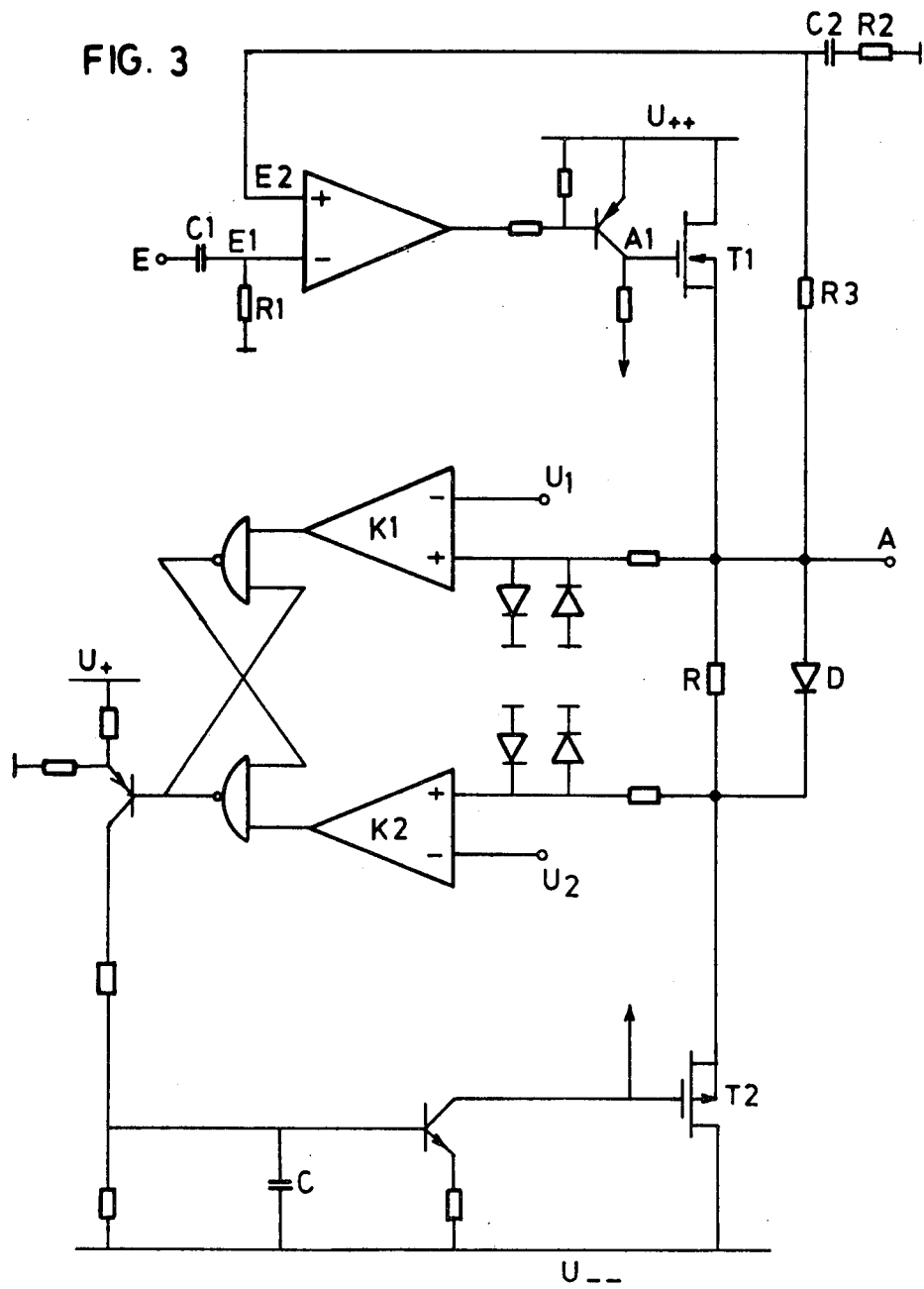
FIG. 3 shows another example of embodiment of the amplifier.

Another example of embodiment of the amplifier is illustrated in FIG. 3.

In the embodiment a module was used including two comparators and two NAND gates. It is supplied with its own operating voltages $U_+$ and $U_-$. As output transistors T1, T2 any desired Darlington or MOSFET power transistors may be used.

Figure 4:
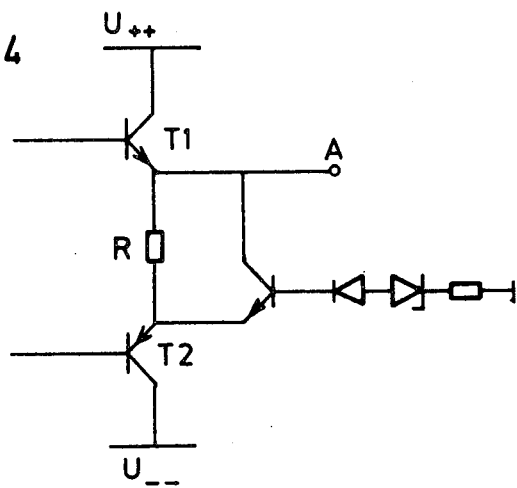
FIG. 4 shows an example of embodiment in which the diode D has been replaced by a controllable transistor.

FIG. 4 shows an example of embodiment in which the diode D has been replaced by a controllable transistor. As a result, the measurement voltage at the resistor R can be increased and possibly regulated (e.g. depending on the output signal level).

Figure 5:
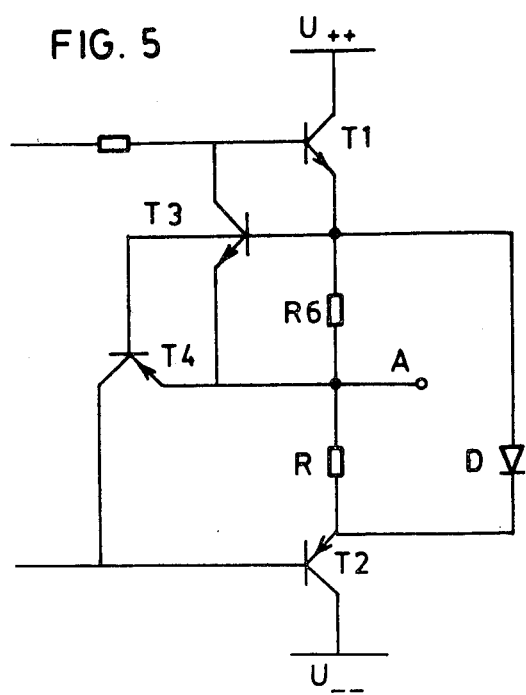
FIG. 5 shows an example of embodiment of a short-circuit protection.

FIG. 5 illustrates an example of embodiment of a short-circuit protection. If the output current is too high a voltage is reached at the resistor R6 which saturates the transistor T3 or T4. A corresponding base-emitter voltage of the transistor T1 or T2 is reduced. The output current is reduced. If a resistor is connected to the load the output current can be limited in accordance with the same principle.

FIGS. 4 and 5 show in simplified form a fragment of the circuit diagram according to FIG. 1. The control circuit for quiescent current regulation has been omitted for reasons of simplicity. It can be seen from FIGS. 2 or 3.

What I claim is:

1. A regulator for a power amplifier with push-pull output stage, including output transistors, said regulator comprising sampling means cascaded with said output transistors for sampling their quiescent current, at least two comparators with inputs connected to said sampling means for sampling quiescent current dependent voltage drops across said inputs, means for supplying reference voltages to said comparators in order to predetermine the voltages at which said voltage drops are sampled, and digital storage means coupled to outputs of said comparators for providing at least one corrective digital signal to analog storage means connection to outputs of said digital storage means, said storage means providing at least one corrective analog signal to said output stage with which analog signal the desired value of quiescent current can be corrected.

2. A regulator as set forth in claim 1, wherein said analog storage means will provide additionally at least one output, whereby the temperature of at least one output transistor of the amplifier can be determined.

3. A regulator as set forth in claim 1, the value of the quiescent current is determined in accordance with the output voltage level of the amplifier, whereby at least one of said reference voltages is determined in accordance with the output voltage level.

4. A regulator as set forth in claim 1, wherein the quiescent current is additionally influenced by a thermal coupling from the output transistors to the digital storage means provided by at least one thermal switch sampling the temperature of at least one of said output transistors.

5. A regulator as set forth in claim 1, including at least one diode bridged across said sampling means to limit voltage drops across them.

6. A regulator as set forth in claim 1, including at least one controllable transistor bridged across said sampling means to limit voltage drops across them.

7. A regulator as set forth in claim 1, wherein the value of the quiescent current is determined in accordance with the output voltage level of the amplifier, whereby said digital storage means receives at least one input signal having a value as determined in accordance with the output voltage level.

8. A regulator as set forth in claim 1, wherein said digital storage means will provide additionally at least one output, whereby the temperature of at least one output transistor of the amplifier can be determined.

* * * * *